(12) United States Patent
Chu et al.

(10) Patent No.: US 12,317,659 B2
(45) Date of Patent: May 27, 2025

(54) METHOD OF MAKING A PACKAGED DEVICE

(71) Applicant: TSLC Corporation, Miao-Li County (TW)

(72) Inventors: Chen-Fu Chu, Hsinchu (TW); Trung Tri Doan, Hsinchu County (TW)

(73) Assignee: TSLC Corporation, Chu-Nan (TW)

( * ) Notice: Subject to any disclaimer, the term of this patent is extended or adjusted under 35 U.S.C. 154(b) by 610 days.

(21) Appl. No.: 17/544,954

(22) Filed: Dec. 8, 2021

(65) Prior Publication Data
US 2023/0178697 A1 Jun. 8, 2023

(51) Int. Cl.
*H10H 20/857* (2025.01)
*H10H 20/01* (2025.01)
*H10H 20/851* (2025.01)
*H10H 20/853* (2025.01)

(52) U.S. Cl.
CPC ........ *H10H 20/857* (2025.01); *H10H 20/851* (2025.01); *H10H 20/853* (2025.01); *H10H 20/0364* (2025.01)

(58) Field of Classification Search
CPC .......... H01L 33/62; H01L 33/50; H01L 33/54
See application file for complete search history.

(56) References Cited

U.S. PATENT DOCUMENTS

| | | | |
|---|---|---|---|
| 2011/0084300 A1* | 4/2011 | Park | H10H 20/857 257/E33.068 |
| 2014/0042450 A1* | 2/2014 | Akiyama | H10D 10/056 438/27 |
| 2017/0098743 A1* | 4/2017 | Chen | H10H 20/8515 |
| 2019/0393198 A1* | 12/2019 | Takeya | H01L 21/6838 |
| 2021/0408347 A1* | 12/2021 | Tamura | G02F 1/133611 |

* cited by examiner

*Primary Examiner* — Mark W Tornow
(74) *Attorney, Agent, or Firm* — Stephen A. Gratton

(57) ABSTRACT

A packaged LED device comprising: a pad-extended LED chip comprising: at least one LED chip having a substrate, a first semiconductor layer, an active layer and a second semiconductor layer; a first pad electrically connected to the first type semiconductor layer and a second pad electrically connected to the second type semiconductor layer; and a first extended metal layer connected to the first pad and a second extended metal layer connected to the second pad.

13 Claims, 23 Drawing Sheets

Top view (First size view)

Backside view (second side view)

PE-LED Chip

Chip in Polymer (CIP) 1001

$d_T$: the thickness of the polymer 30 payer

Chip in Polymer CIP 1002

$d_T$: the thickness of the polymer 30 payer

First side view

Packaged LED 100 picture

Packaged LED 101

Packaged LED 102

Packaged LED 102 picture

Packaged LED 103

Packaged LED 104

METHOD OF MAKING A PACKAGED DEVICE

TECHNICAL FIELD

This disclosure relates generally to a packaged device, and more particularly to a light emitting diode packaged having a batwing light pattern and a method for manufacturing.

BACKGROUND

For the MiniLED backlights have a lot of interest for use in LCDs in the recent years. MiniLED backlights can offer advantages over other flat-panel display technologies, especially in high brightness, high contrast ratio, lower power consumption, high speed local dimming, and higher efficiency. The advanced performance enabling MiniLED backlights attractive for use in a variety of applications, ranging from high resolution TVs to IT device such as monitor, tablet, smart phone, smart watch, smart ring applications. Automotive and industrial applications are also advantageously addressed by MiniLED backlight technologies due to its higher brightness and higher contrast ratio.

MiniLEDs are ideally sized for integration into LCD backlights with local dimming capability. By increasing the number of local dimming zones, MiniLED backlight LCD panels can achieve a contrast ratio above 1,000,000:1 and higher efficiency without sacrificing brightness. Thus, MiniLED backlight LCD panels can meet HDR (High Dynamic Range) specifications. The thickness of the panel is also reduced, compared with displays using conventional full array local dimming.

In general, the MiniLED backlight module has multiple LEDs bonded on a backplane and a diffusion molding and/or lens to spread the light to achieve a uniform panel light. The backplane has designed circuitry layout to drive the LEDs. Typically, the LED chip or the packaged LED has a Lambertian light pattern in a far field. The center light intensity of the LED chip or the packaged LED is high. Thus, a thicker diffusion molding is needed to spread out the light for a uniform light panel. For the smart carry devices such as laptop, tablet, small size screen, smart phone, smart watch, smart ring, the panel thickness as thin as possible is the most concern issue to fabricate a display panel in applications. Therefore, the packaged LED having a batwing light pattern in far field is desired to provide a lateral uniform light. The pre-made lateral uniform light distribution pattern could help to superior reduce the thickness of the diffusion molding. The thickness of the backlight module is further advance reduced to achieve the needed applications.

SUMMARY

An embodiment of the present disclosure is directed to a pad-extended LED chip comprising: a LED chip having a substrate, a first semiconductor layer, an active layer and a second semiconductor layer; and a first pad electrically connected to the first type semiconductor layer and a second pad electrically connected to the second type semiconductor layer; and a first extended metal layer connected to the first pad and a second extended metal layer connected to the second pad; wherein: a first extended pad connected to the first extended metal layer and a second extended pad connected to the second extended metal layer; wherein: The size of the first extended pad is larger that of the first extended metal layer; and the size of the second extended pad is larger than that of the second extended metal layer.

Another embodiment of the present disclosure is directed to a packaged LED device comprising: a pad-extended LED chip wherein: at least one LED chip having a substrate, a first semiconductor layer, an active layer and a second semiconductor layer; and a first pad electrically connected to the first type semiconductor layer and a second pad electrically connected to the second type semiconductor layer; and a first extended metal layer connected to the first pad and a second extended metal layer connected to the second pad. The packaged LED further comprising: a polymer layer covered substantial the surfaces of the pad-extended LED chip except the second surface of the first extended metal layer and the second surface of the second extended metal layer. a first extended pad electrically connected to the first extended metal layer and a second extended pad electrically connected to the polymer and the second extended metal layer; wherein: an opaque layer disposed on top of the polymer layer.

Another embodiment of the present disclosure is directed to a packaged LED device comprising: a pad-extended LED chip wherein: at least one LED chip having a substrate, a first semiconductor layer, an active layer and a second semiconductor layer; and a first pad electrically connected to the first type semiconductor layer and a second pad electrically connected to the second type semiconductor layer; and a first extended metal layer connected to the first pad and a second extended metal layer connected to the second pad. The packaged LED device further comprising: a polymer layer covered substantial the surfaces of the pad-extended LED chip except the second surface of the first extended metal layer and the second surface of the second extended metal layer; and an opaque layer disposed on top of the polymer layer; and a first extended pad in contact with the polymer and disposed on the second surface of the first extended metal layer and electrically connected to the first type semiconductor layer; and a second extended pad in contact with the polymer and disposed on the second surface of the second extended metal layer and electrically connected to the second type semiconductor layer.

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

DETAILED DESCRIPTION

Figure 1A:
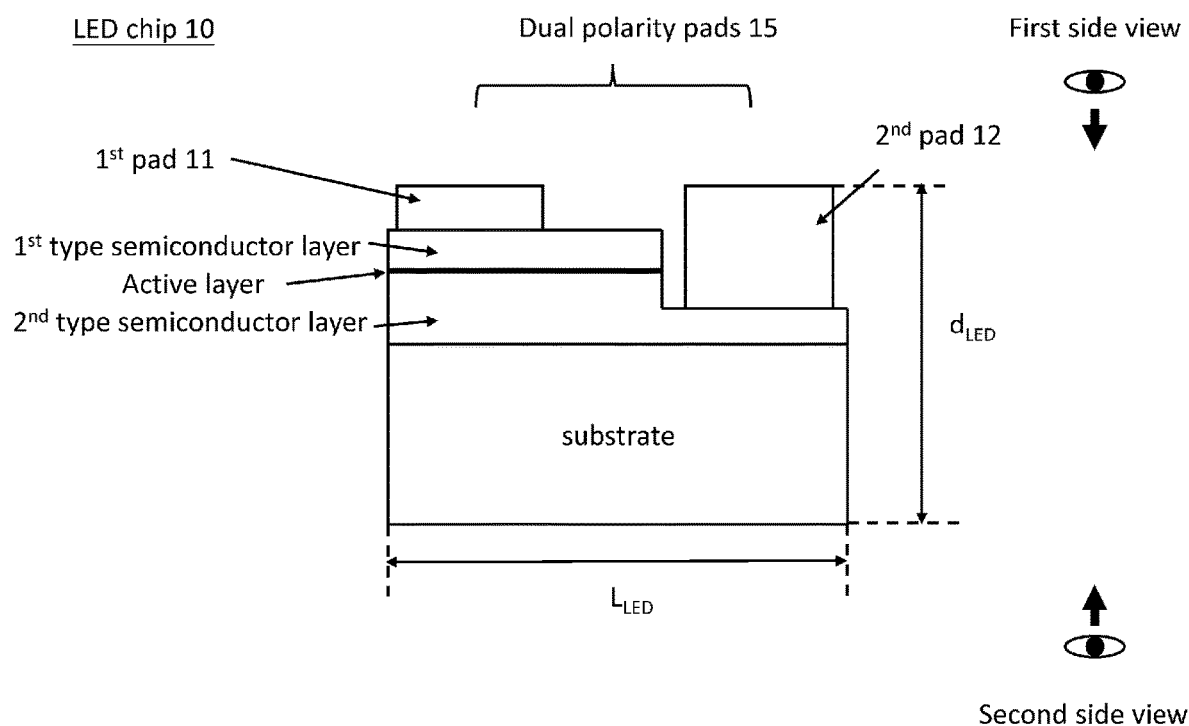
FIG. 1A shows a LED chip structure 10.

In the disclosure, the terminology used is for the purpose of describing particular embodiments only and is not intended to be limiting of inventive concepts. As used herein, the singular forms "a," "an" and "the" are intended to include the plural forms as well, unless the context clearly indicates otherwise. It will be further understood that the terms "comprises" and/or "comprising," when used in the disclosure, specify the presence of stated features, integers, steps, operations, elements, and/or components, but do not preclude the presence or addition of one or more other features, integers, steps, operations, elements, components, and/or groups thereof.

It will be understood that, although the terms "first" and "second" may be used herein to describe various elements, components, and/or sections, these elements, components, and/or sections should not be limited by these terms. These terms are only used to distinguish one element, component, or section from another element, component or section. Thus, a first element, component, or section discussed below could be termed a second element, component, or section without departing from the teachings of inventive concepts.

Commonly used predefined terms may be construed as having the same or similar meaning as the contextual meanings of the related art and are not to be construed as an ideal or overly formal sense unless expressly defined to the contrary herein. In some cases, the terms defined herein may not be construed to exclude embodiments of the inventive concepts.

Various example embodiments in accordance with principles of inventive concepts will now be described more fully with reference to the accompanying drawings in which some embodiments are shown. Inventive concepts may, however, be embodied in different forms and should not be construed as limited to the embodiments set forth herein. Rather, these embodiments are provided so that this disclosure is thorough and complete and fully conveys inventive concepts to those skilled in the art. In the drawings, the sizes and relative sizes of layers and regions may be exaggerated for clarity.

Figure 1B:
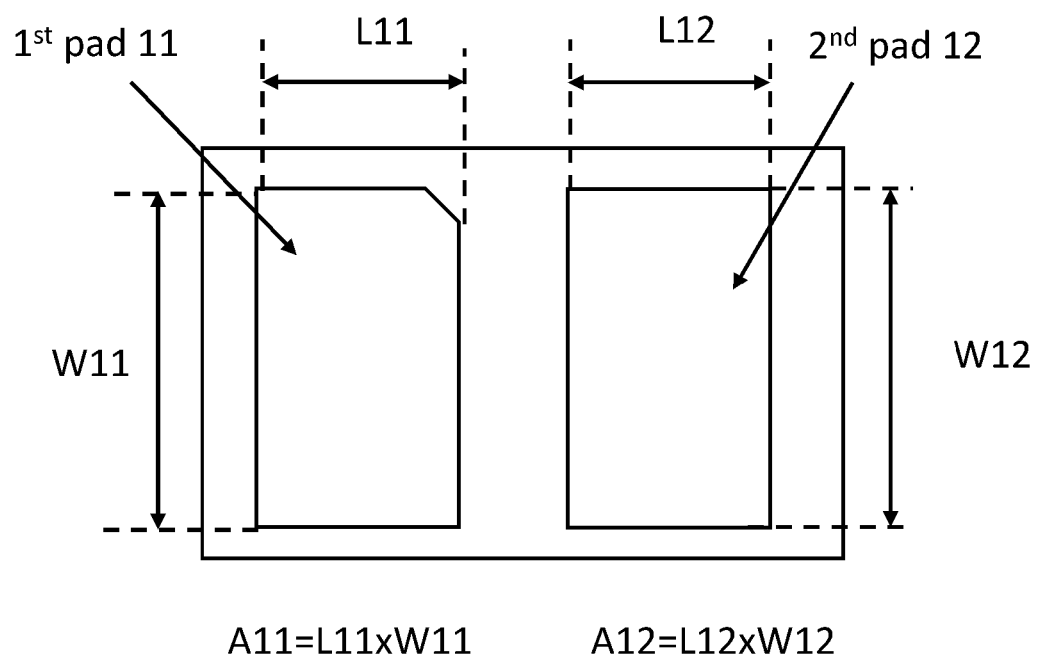
FIG. 1B is the top view (first side view) of the LED chip 10.
Figure 1C:
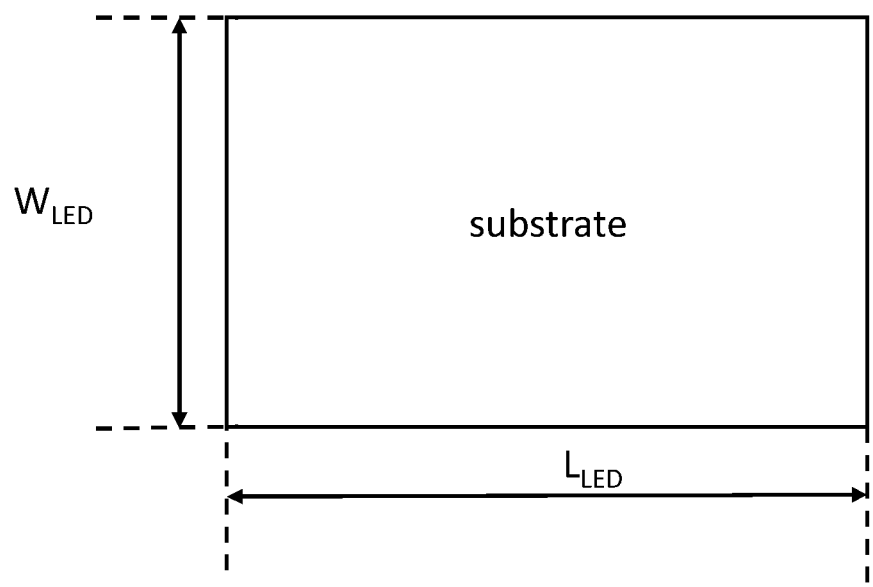
FIG. 1C is a backside view (second side view) of the LED chip 10.

FIG. 1A shows a LED chip structure 10. The LED chip 10 having a substrate, a first semiconductor layer, an active layer and a second semiconductor layer. A first pad 11 is electrically connect to the first type semiconductor layer and a second pad 12 is electrically connected to the second type semiconductor layer. It is desirable to have the first pad 11 height substantially the same height as the second pad so that the chip would be flat when bonded to a lead frame or a ceramic substrate. When the first and second pads are at the same height level, the die bonding would be easier and stronger; however, due to process variation, the height differences between the two pads could be several thousand angstrom. The LED chip has a thickness $d_{LED}$; $d_{LED}$ could be ranging from few microns meter to 200 um. Typically, the LED chip thickness $d_{LED}$ is about 100 um. In some cases, the LED has a current spreading design to make one polarity of the LED pads in the middle or center and the other polarity of the LED pads in the double or multiple sides or in the corners; thus, the LED could have more than two pads. In some cases, the substrate is removed leaving only the a first semiconductor layer, an active layer, a second semiconductor layer and the Pads. FIG. 1B is a top view (first side view) of the LED chip 10. The length of the first pad 11 is L11 and the width of the first pad 11 is W11. The area of the first pad is A11=L11×W11. The length of the second pad 12 is L12 and the width of the second pad 12 is W12. The area of the first pad is A12=L12×W12. FIG. 1C is the backside view (second side view) of the LED chip. The LED chip 10 has a length $L_{LED}$ and a width $W_{LED}$. The size of the $L_{LED}$ is the same or larger than that of $W_{LED}$.

Figure 2A:
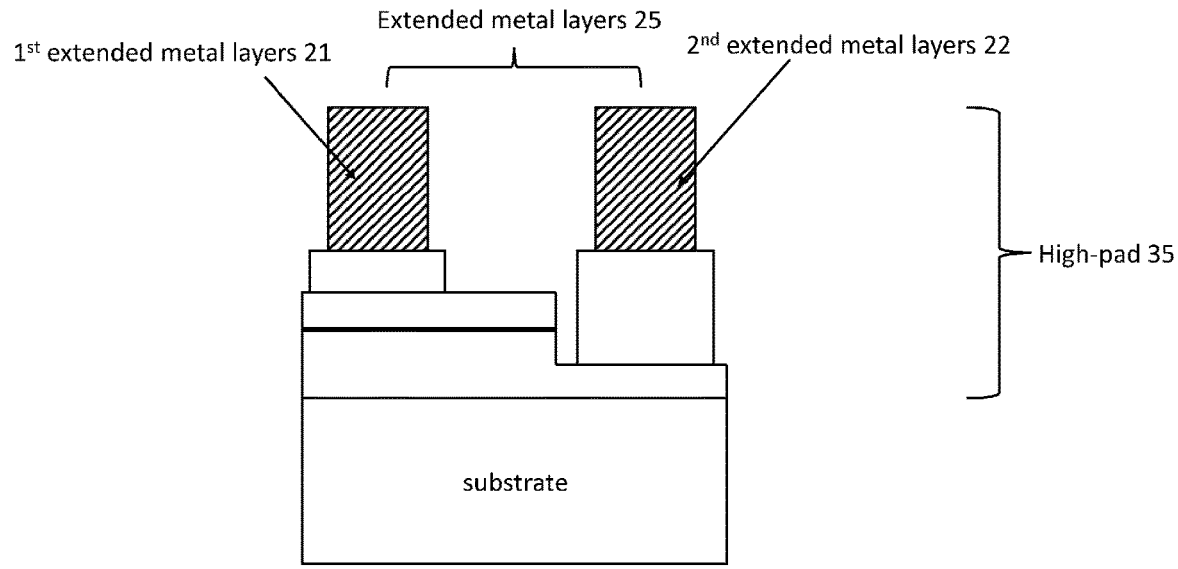
FIG. 2A shows a pad-extended LED chip 20 structure

FIG. 2A shows a pad-extended LED (PE-LED) chip 20 structure comprising a LED chip 10 and extended metal layers 25. The pad-extended LED chip 20 having extended metal layers 25 disposed on and making electrical contact to the pads (pad 11 and pad 12). A first extended metal layers 21 disposed on the first pad 11 and electrically connected to the first pad 11 and the first semiconductor layer. A second extended metal layers 22 disposed on the second pad 12 and electrically connected to the second pad 12 and the second semiconductor layer. In some cases, the LED could have more than two pads design. There could have a third extended metal disposed and connected to a third pad of the LED as needed.

Figure 2B:
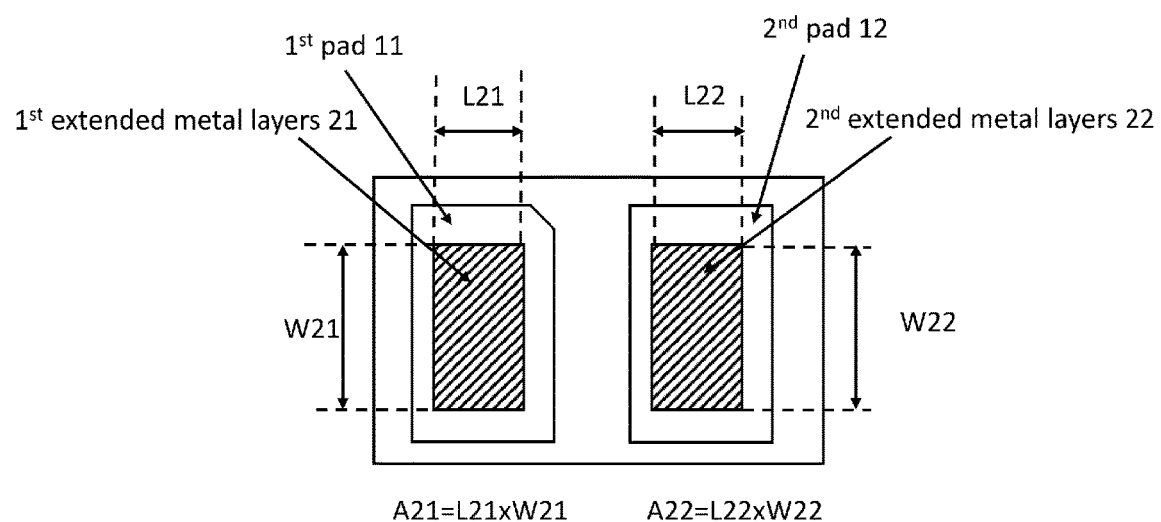
FIG. 2B is a first side view of the pad-extended LED chip 20.
Figure 2C:
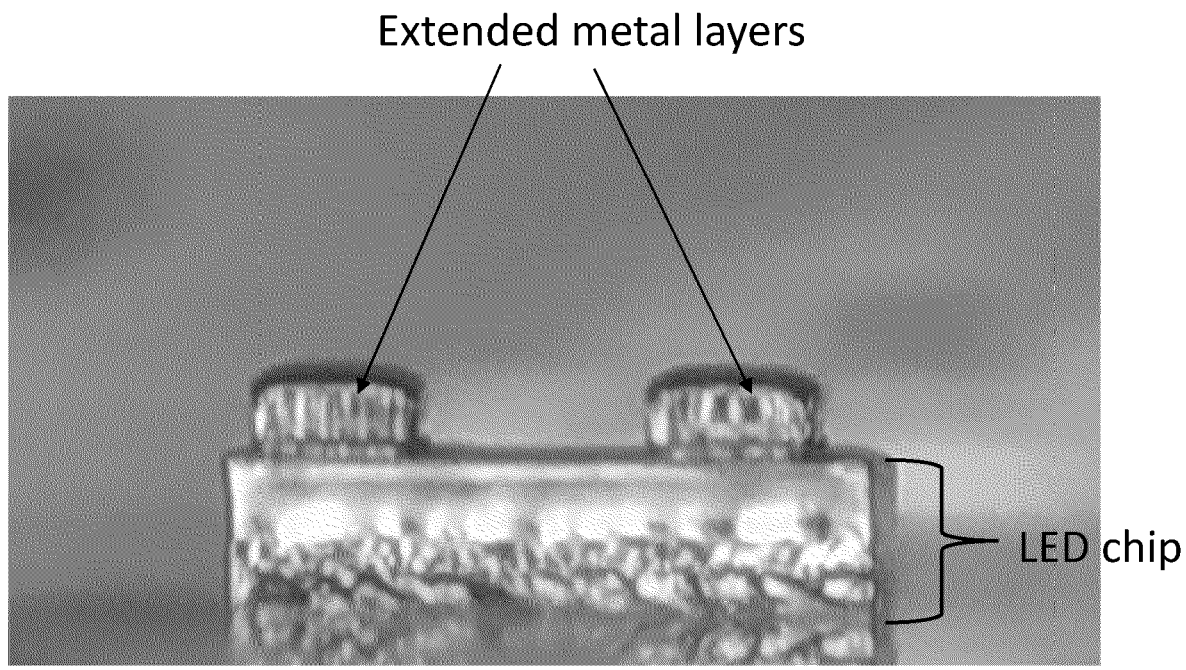
FIG. 2C shows a picture of the LED chip.

FIG. 2B is a first side view of the PE-LED chip 20 comprising LED chip having the extended metal layers. The length of the first extended metal layers 21 is L21 and the width of the first the extended metal layers 21 is W21. The area of the first the extended metal layers 21 is A21=L21×W21. The length of the second the extended metal layers 22 is L22 and the width of the second extended metal layers 22 is W22. The area of the first extended metal layers 22 is A22=L22×W22. Referring to FIG. 1A, the area of the first extended metal layer A21 is smaller than that of the area of the area of the first pad A11 and the area of the second extended metal layer A22 is smaller than that of the area of the area of the second pad A12. FIG. 2C shows a picture of the PE-LED chip (LED chip having the extended metal layers). The extended metal layers 25 could be formed before or after singulating dies by utilizing a mask, photo and etch or lift-off. The formation of the extended metal layers 25 could be selected from at least one of e-beam evaporation, thermal evaporation, sputter, electro-plating, chemical plating, bumping, screen printing, 3D printing, wire bonding ball. The thickness of the extended metal layers 25 is larger than 10 um and typically 30-50 um. Please be noted that the pads and the extended metal layers 25 could be fabricated together in one step in the LED wafer form process before singulating dies. In this case, the pads and extended metal layers 25 could be called as a high-pad 35. The thickness of the high-pad 35 could be larger than 10 um.

Figure 3:
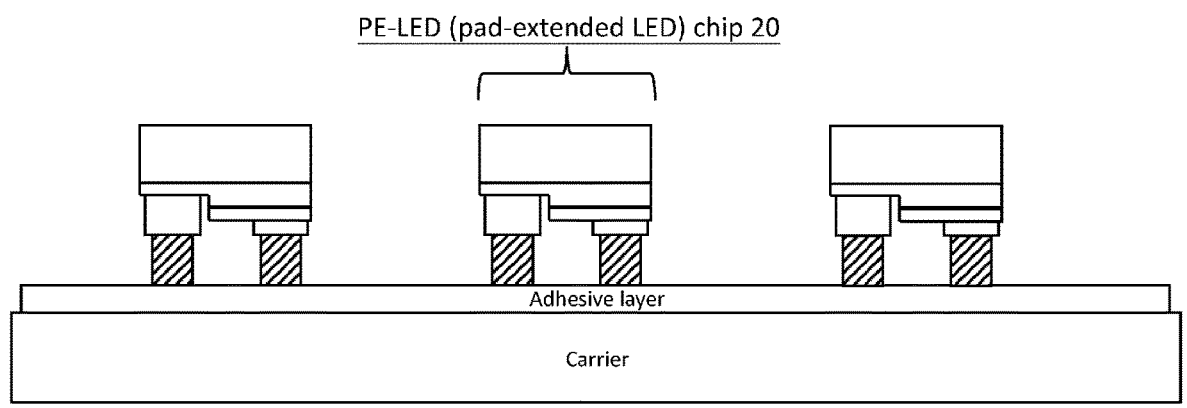
FIG. 3 shows multiple pad-extended LED chips 20 disposed on a carrier.

FIG. 3 shows multiple PE-LED (pad-extended LED) chips 20 disposed on a carrier. The extended metal layers of the multiple pad-extended LED chips are contact to a carrier via an adhesive layer of the carrier or other means such as electrostatic or magnetic force.

Figure 4:
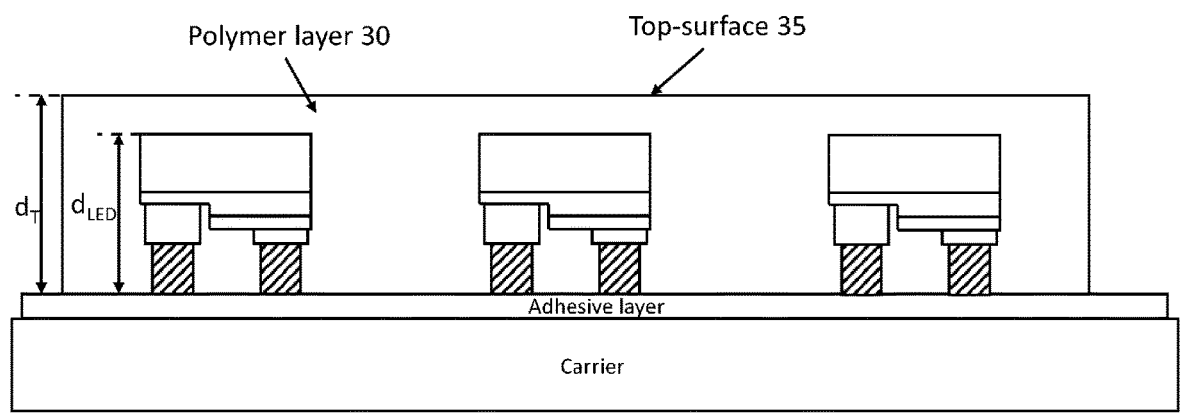
FIG. 4 shows a polymer 30 having a thickness of $d_T$ disposed above the LED chips

FIG. 4 shows a polymer 30 having a thickness of $d_T$ disposed above the LED chips; the polymer layer 30 could be formed by using molding or dispensing or depositing or screen printing to cover the pad-extended LED chips and the adhesive layer of the carrier; thus, the pad-extended LED chip is covered by the polymer layer 30; the bottom surface of the extended metal layers is still in contacted with and on the adhesive layer. The polymer layer 30 forming a new top surface (top-surface 35) above the PE-LED chip; In one preferred embodiment the polymer layer 30 is a transparent layer; however, one could mix it with particles of $Al_2O_3$, $TiO_2$ or $SiO_2$ or other powders to change the optical property of this layer. Layer 30 could be selected from Silicone or polysiloxane (-R2Si-SiR2-, where R=organic group), Flourocarbon CxFy, polyexpoxide, acrylate polymer, Poly(methyl methacrylate) (PMMA), SOG (spin-on-Glass).

The polymer layer 30 could be formed by molding, spraying, dispensing or jetting; In one embodiment, the top surface of the polymer layer 30 has substantially flat property to keep an uniform thickness of the polymer layer 30. The flat property of the polymer layer 30 could be achieved through a planarization process such as molding, doctor blade, grinding, polishing, shaving. The polymer layer 30 could be selected from at least one of epoxy, silicone, hybrid silicone and epoxy, glue, acrylic, wax, Polyimide (PI), Polybenzoxazole (PBO), Benzocyclobutene (BCB). For the case of spraying, dispensing or jetting of the polymer layer 30, the top surface (the first surface) might be rough after dispensing and curing, a planarization process could be applied to planar the top surface to be substantially flat. In one preferred embodiment the polymer layer 30 is a transparent layer; however, one could mix it with particles of $Al_2O_3$, $TiO_2$ or $SiO_2$ or other powders to change the optical property of this layer. The polymer layer 30 could be selected from Silicone or polysiloxane (-R2Si-SiR2-, where R=organic group), Flourocarbon CxFy, polyexpoxide, acrylate polymer, Poly(methyl methacrylate) (PMMA), SOG (spin-on-Glass). The polymer layer 30 $d_T$ could be the same height or higher than the PE-LED chips ($d_T \geq d_{LED}$); it is preferred to have $d_T$ higher than the PE-LED ($d_T > d_{LED}$).

Figure 5:
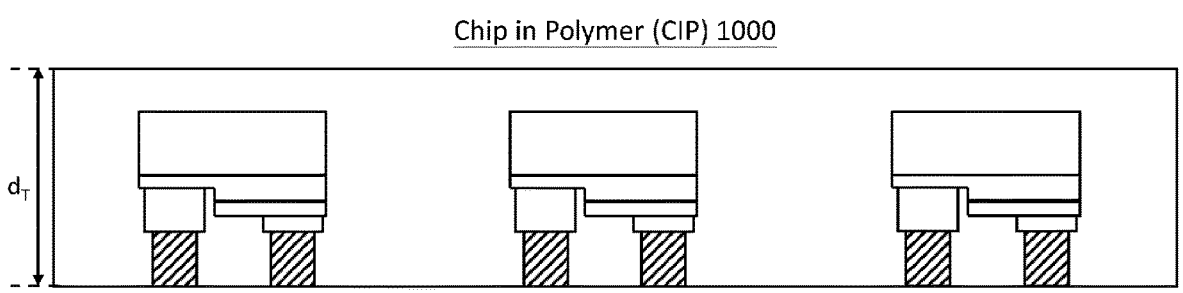
FIG. 5 is a chip in polymer ("CIP") 1000 having multiple pad-extended LED chips in a polymer.

Referring to FIG. 4, the carrier and the adhesive layer is removed. FIG. 5 is a chip in polymer CIP 1000 having multiple pad-extended LED chips in a polymer layer 30. The polymer 30 has a thickness of $d_T$ which is the same or higher than the PE-LED chip. The extended metal layers 25 of the multiple pad-extended LED chips is exposed to the bottom surface (the second surface) of the polymer layer 30.

In some cases, the bottom surface of the extended metal layers 25 might be contaminated by the polymer layer 30 or the adhesive layer or contaminant. The contaminant could be removed by wet or dry etching, scrubbing, CMP, polishing, cleaning the bottom surface (the second surface). The contaminant removal process could remove some polymer layer 30 and the extended metal layers 25 during the process.

Figure 6:
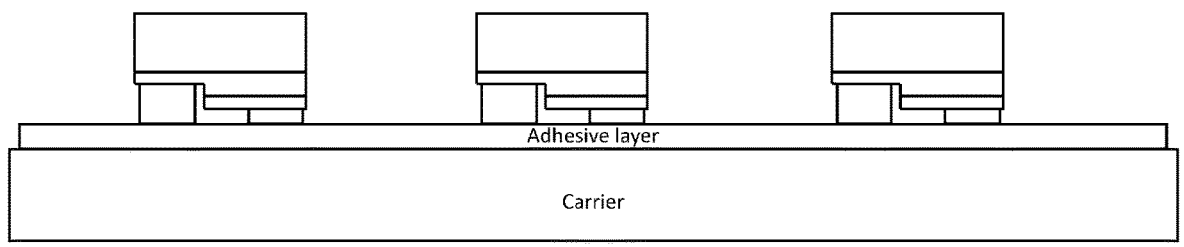
FIG. 6 shows multiple LED chips flipped on the adhesive layer of a carrier.

In one embodiment, referring to FIG. 1, FIG. 6 shows multiple LED chips is flipped on the adhesive layer of a carrier. The first pad 11 and the second pad 12 of the LED chip is contacted with the adhesive layer.

Figure 7:
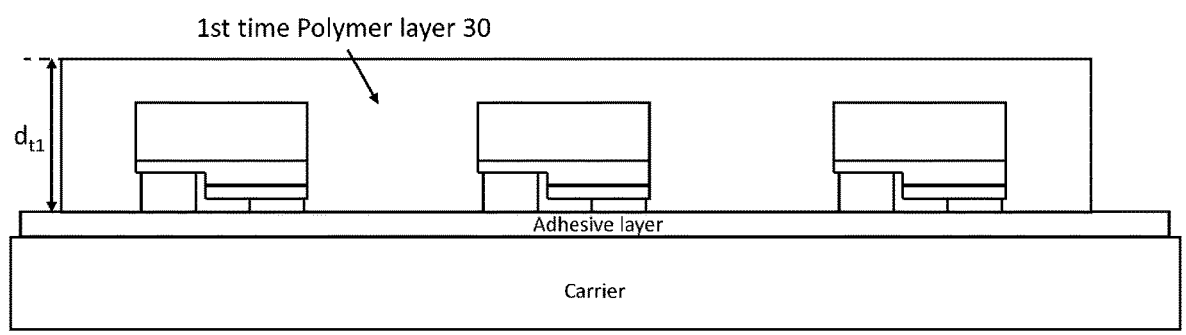
FIG. 7 shows a first-time polymer layer 30 having a thickness of $d_{t1}$ is molded or dispensed to cover the LED chips and the adhesive layer of the carrier.

FIG. 7 shows a first-time polymer layer 30 having a thickness of $d_{t1}$ is molded or dispensed to cover the LED chips and the adhesive layer of the carrier; thus, LED chip is in the polymer layer, but the bottom surface of the pads of the LED chips is contacted on the adhesive layer. Typically, the polymer layer 30 is an optical transparent layer. The polymer layer 30 could be selected from at least one of epoxy, silicone, hybrid silicone and epoxy, glue, acrylic, wax, Polyimide (PI), Polybenzoxazole (PBO), Benzocyclobutene (BCB). For the case of spraying, dispensing or jetting of the polymer layer 30, the top surface (the first surface) might be rough after dispensing and curing, a planarization process could be applied to planar the top surface to be substantially flat. In one preferred embodiment the polymer layer 30 is a transparent layer; however, one could mix it with particles of $Al_2O_3$, $TiO_2$ or $SiO_2$ or other powders to change the optical property of this layer. The polymer layer 30 could be selected from Silicone or polysiloxane (-R2Si-SiR2-, where R=organic group), Flourocarbon CxFy, polyexpoxide, acrylate polymer, Poly(methyl methacrylate) (PMMA), SOG (spin-on-Glass).

Figure 8:
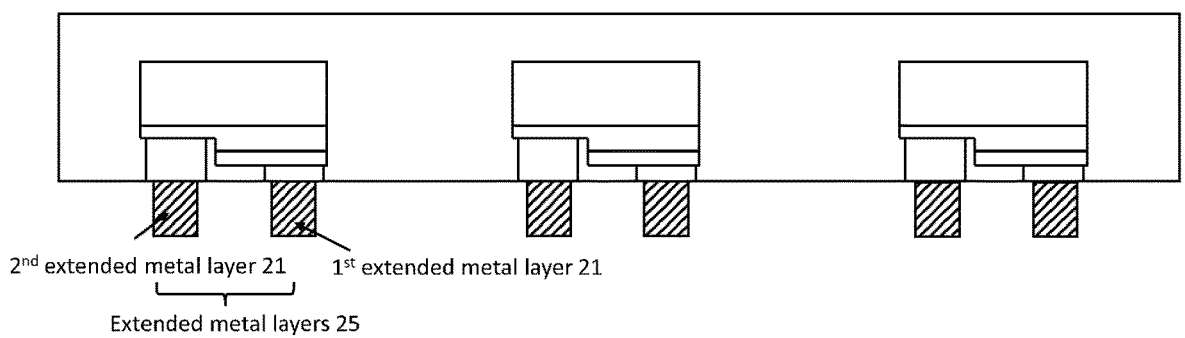
FIG. 8 shows an extended metal layers 25 disposed on the pads of the LED chips.

FIG. 8 shows an extended metal layers 25 disposed on the pads of the LED chips. The extended metal layers 25 could be formed before or after singulating dies by utilizing a mask to form metal layers 25 using at least one of e-beam evaporation, thermal evaporation, sputter, electro-plating, chemical plating, bumping, screen printing, 3D printing, wire bonding ball. The thickness of the extended metal layers 25 is larger than 10 um and typically 30-50 um. Please be noted that the pads and the extended metal layers 25 could be fabricated together in one step in the LED wafer form process before singulating dies. In this case, the pads and extended metal layers 25 could be called as a high-pad 35. The thickness of the high-pad 35 could be larger than 10 um.

Figure 9:
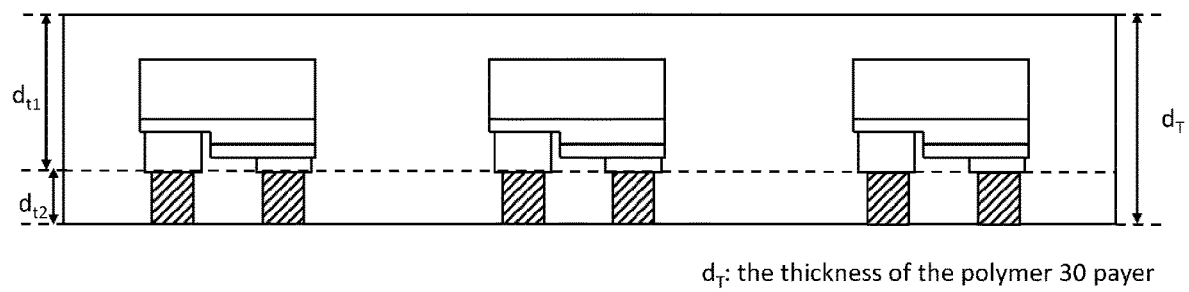
FIG. 9 is a chip in polymer CIP 1001.

FIG. 9 is a chip in polymer (CIP) 1001. A second-time polymer layer 30 having a thickness of $d_{t2}$ is molded or dispensed to cover the extended metal layers 25 except the bottom surface of the extended metal layers. The thickness of total polymer layer ($d_T$) is added by the first-time polymer $d_{t1}$ and the second-time polymer $d_{t2}$. The $d_T$ could be the same or higher than the PE-LED chip. In some case, the bottom surface of the extended metal layers 25 could be covered by the second-time polymer layer 30. A planarization or wet or dry etch removal process could be applied to re-expose the bottom surface of the extended metal layers 25, resulting in a new $D_{t2}$ thickness (not shown; $D_{t2}<d_{t2}$) which is the same height of the extended metal layer 25. The total polymer thickness dT ($d_{t1}+D_{t2}$) could be the same or higher than the PE-LED chip.

Please note that the first-time used polymer layer 30 or the second-time used polymer layer 30 could be the same polymer material; however, this is optional selection of the polymer 30. The polymer material could be same material having different refractive index. The polymer could be different material such as one is silicone and another one is epoxy. The polymer layer 30 could be selected from at least one of epoxy, silicone, hybrid silicone and epoxy, glue, acrylic, wax, Polyimide (PI), Polybenzoxazole (PBO), Benzocyclobutene (BCB). For the case of spraying, dispensing or jetting of the polymer layer 30, the top surface (the first surface) might be rough after dispensing and curing, a planarization process could be applied to planar the top surface to be substantially flat. In one preferred embodiment the polymer layer 30 is a transparent layer; however, one could mix it with particles of $Al_2O_3$, $TiO_2$ or $SiO_2$ or other powders to change the optical property of this layer. The polymer layer 30 could be selected from Silicone or polysiloxane (-R2Si-SiR2-, where R=organic group), Flourocarbon CxFy, polyexpoxide, acrylate polymer, Poly(methyl methacrylate) (PMMA), SOG (spin-on-Glass).

Figure 10:
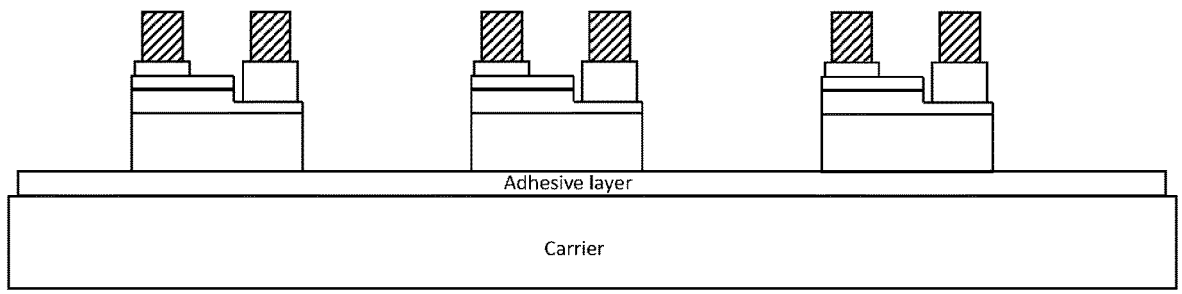
FIG. 10 shows the substrate side of the multiple pad-extended LED (PE-LED) chip is disposed on the adhesive layer of a carrier.

In one embodiment, referring to FIG. 2, FIG. 10 shows the substrate side of the multiple pad-extended LED chip is disposed on the adhesive layer of a carrier.

Figure 11:
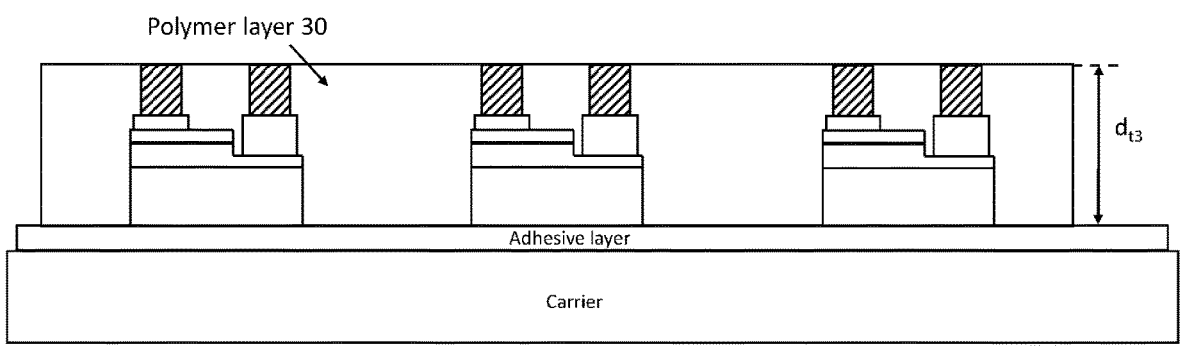
FIG. 11 shows a first-time used polymer 30 having a thickness of $d_{t3}$ is molded or dispensed to cover the pad-extended LED chips and the bottom surface of the extended metal layers is exposed.

FIG. 11 shows a first-time used polymer 30 having a thickness of $d_{t3}$ is molded or dispensed to cover the pad-extended LED chips and the bottom surface of the extended metal layers is exposed. Typically, the polymer layer 30 is an optical transparent layer.

The first-time used polymer layer 30 could be formed by molding, spraying, dispensing or jetting. In one embodiment, the top surface of the polymer layer 30 has substantially flat property to keep an uniform thickness of the polymer layer 30. The flat property of the polymer layer 30 could be achieved through planarization process such as molding, grinding, polishing, shaving. The polymer layer 30 could be selected from at least one of epoxy, silicone, hybrid silicone and epoxy, glue, acrylic, wax, Polyimide (PI), Polybenzoxazole (PBO), Benzocyclobutene (BCB). The bottom surface (the second surface) might be covered by the polymer material, a planarization process could be applied to expose the bottom surface of the extended metal layers 25. In one preferred embodiment the polymer layer 30 is a transparent layer; however, one could mix it with particles of $Al_2O_3$, $TiO_2$ or $SiO_2$ or other powders to change the optical property of this layer. The polymer layer 30 could be selected from Silicone or polysiloxane (-R2Si-SiR2-, where R=organic group), Flourocarbon CxFy, polyexpoxide, acrylate polymer, Poly(methyl methacrylate) (PMMA), SOG (spin-on-Glass).

Figure 12:
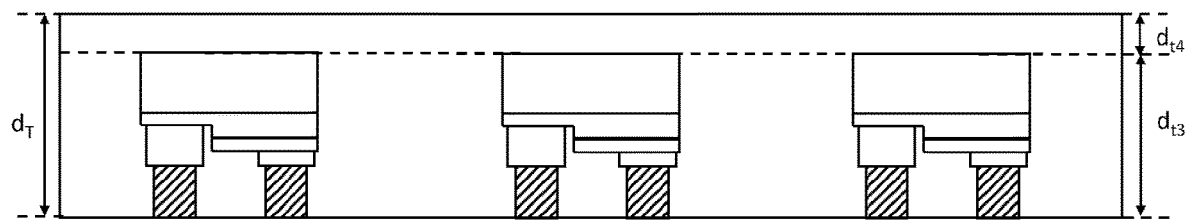
FIG. 12 is a chip in polymer CIP 1002.

Referring to FIG. 11, after removing the carrier and adhesive layer, FIG. 12 is a chip in polymer CIP 1002. A second-time polymer layer 30 having a thickness $d_{t4}$ is disposed on the top surface (first surface) of the substrate. The total thickness of the polymer layer 30 is $d_T$ ($d_T=d_{t3}+d_{t4}$) and specific in FIG. 12.

For the chip in polymer CIP 1002, please note that the first-time used polymer layer 30 or the second-time used polymer layer 30 could be the same polymer material; however, this is optional selection of the polymer 30. The polymer material could be same material having different refractive index. The polymer could be different material such as one is silicone and another one is epoxy.

Referring to FIG. 5, FIG. 9 and FIG. 12, FIG. 13 shows a diffusion layer 40 having a thickness of $d_D$ is disposed on top of the polymer layer 30. The diffusion layer 40 could scatter the light of the light from the LED chip or the light form the LED chip could be diffused reflection by the diffusion layer 40 on the top surface of the polymer layer 30. The diffusion layer 40 is an opaque or a semi-opaque material layer. In some embodiment, the light from the LED chip could scatter in the diffusion layer 40 and the scattering light could through the diffusion layer 40 and be seen from the top surface of the diffusion layer. The diffusion layer 40 could be a semi-opaque layer or opaque layer depended on the thickness of the diffusion layer and the particle/powder concentration of the diffusion layer.

The diffusion layer 40 could be a transparent material mixing with particles or powders. The mixing rate could be ranging from 0.0001 wt % to 90 wt % of the powders. The transparent material of the diffusion layer 40 could be selected from at least one of epoxy, silicone, hybrid silicone and epoxy, glue, acrylic, wax, Polyimide (PI), Polybenzoxazole (PBO), Benzocyclobutene (BCB), polysiloxane (-R2Si-SiR2-, where R=organic group), Flourocarbon CxFy, polyexpoxide, acrylate polymer, Poly(methyl methacrylate) (PMMA), SOG (spin-on-Glass). The particles or powders of the diffusion layer could be selected from at least one of $SiO_2$, SiC, $TiO_2$, $Al_2O_3$, Carbon, metals, phosphor. In one preferred embodiment the diffusion layer 40 is an opaque or a semi-opaque material layer; however, one could an optical transparent layer. The diffusion layer could be selected from at least one of epoxy, silicone, hybrid silicone and epoxy, glue, acrylic, wax, Polyimide (PI), Polybenzoxazole (PBO), Benzocyclobutene (BCB), polysiloxane (-R2Si-SiR2-, where R=organic group), Flourocarbon CxFy, polyexpoxide, acrylate polymer, Poly(methyl methacrylate) (PMMA), SOG (spin-on-Glass).

Figure 13:
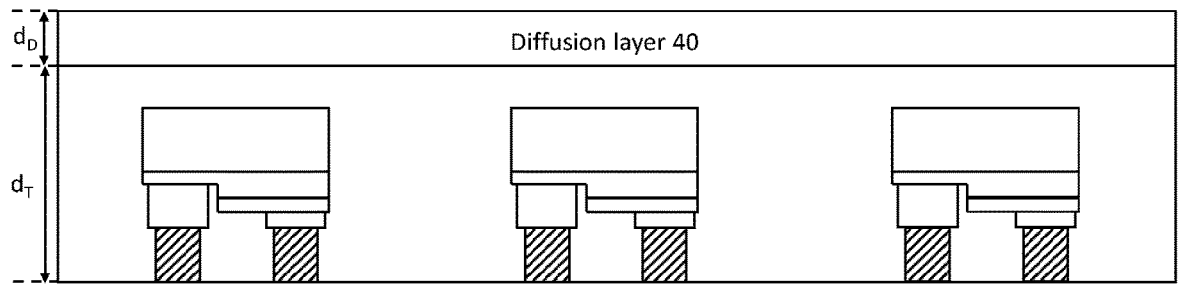
FIG. 13 shows a diffusion layer 40 having a thickness of $d_D$ is disposed on top of the polymer layer 30.
Figure 14:
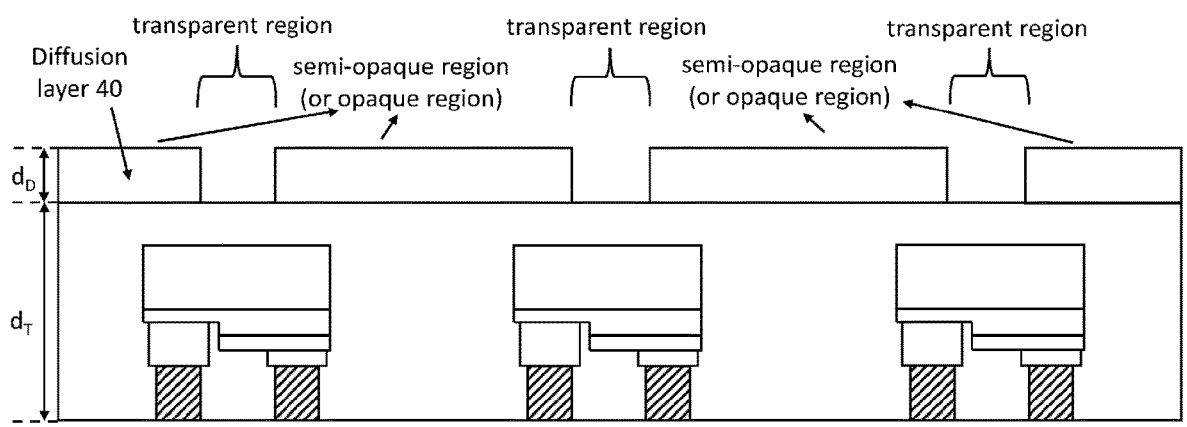
FIG. 14 shows a diffusion layer 40 could be patterning to have a portion of a transparent region and a portion of a semi-transparent region.

Referring to FIG. 13, FIG. 14 shows a diffusion layer 40 could be patterning to have a portion of a transparent region and a portion of a semi-transparent region. The transparent region is a region that could transparent the light >50%. The semi-transparent region is a region that could only transparent the light <10%. The non-transparent region is a region that could only transparent the light 0%. The light from the LED chip could pass through the transparent region to the top area and the light could be only partial (or few percentage) pass through the semi-transparent region to the top area. In some embodiment, the semi-transparent region is approaching to be a non-transparent region. Thus, for the semi-transparent region, the light from the LED could not be passed into the top area.

Figure 15:
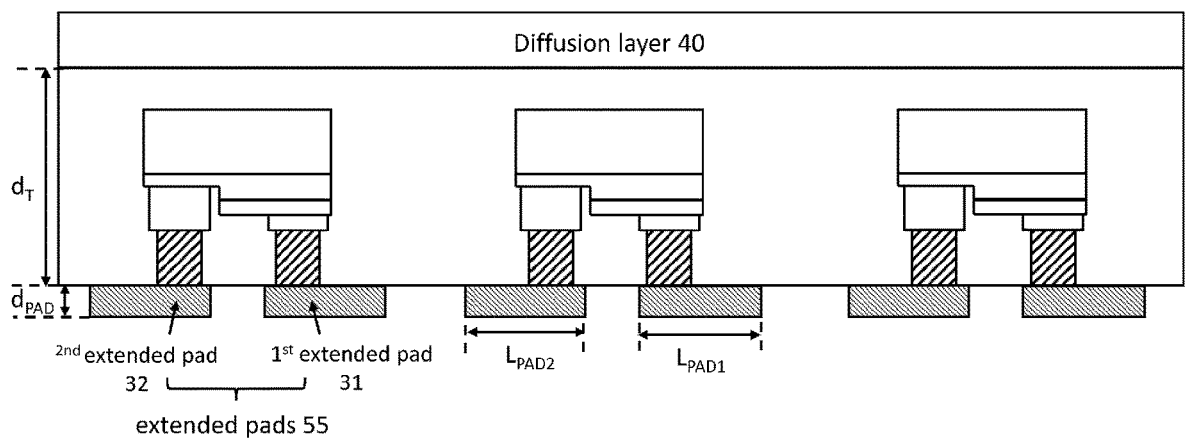
FIG. 15 shows an extended pads 55 disposed on the bottom surface (second surface) of the extended metal layers.

Referring to FIG. 13, FIG. 15 shows an extended pads 55 disposed on the bottom surface (second surface) of the extended metal layers. The 1$^{st}$ extended pad 31 disposed on the second surface of the 1$^{st}$ extended metal layer 21 and electrically connected to the 1$^{st}$ type semiconductor layer. The 2$^{nd}$ extended pad 32 disposed on the second surface of the 2$^{nd}$ extended metal layer 22 and electrically connected to the 2$^{nd}$ type semiconductor layer. The thickness of the extended pads 55 $d_{PAD}$ is >1 um and typically is ranging from 5 um to 50 um. Typically, the size of the first extended pad is larger that of the first extended metal layer 21; and the size of the second extended pad is larger than that of the second extended metal layer 22. As shown in FIG. 15, the length of the first extended pad $L_{PAD1}$ is larger than that of the first extended metal layers 21 and even the first pad 11. The length of the second extended pad $L_{PAD2}$ is larger than that of the second extended metal layers 22 and even the second pad 12.

Figure 16:
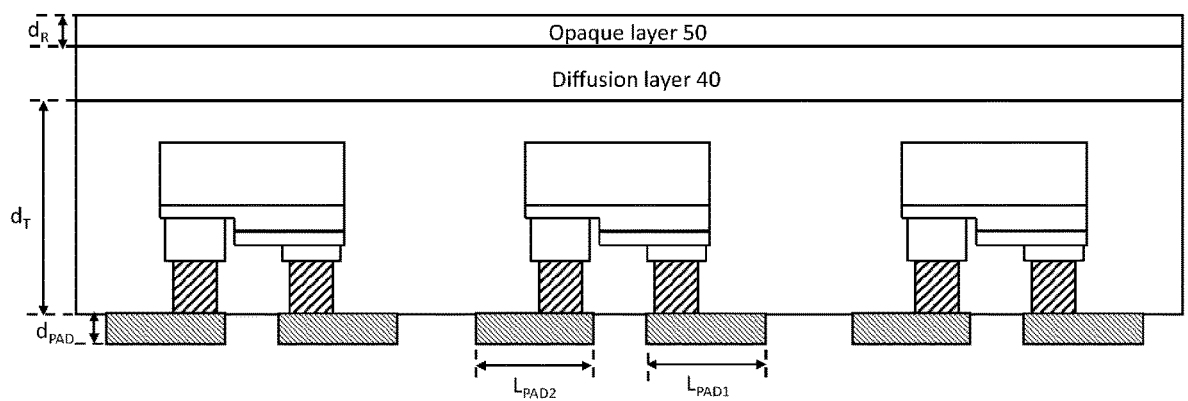
FIG. 16 shows an opaque layer 50 having a thickness $d_R$ is disposed on the diffusion layer 40.

Referring to FIG. 15, FIG. 16 shows an opaque layer 50 having a thickness $d_R$ is disposed on the diffusion layer 40. The opaque layer 50 could have a light reflection property to reflect the light to reflecting light hitting the bottom surface of the opaque layer 50. The light from the LED chip could be reflected by the bottom surface of the opaque layer 50. The light from the LED chip may have multiple reflection and escape from the edge of the packaged LED. The top surface of the opaque layer 50 could have the light reflection property to reflect the light hitting the top surface of the opaque layer 50. The opaque layer 50 could be selected from metal layers and at least from one of Ti. Cr. Ni, Al, Ag, Au, W, TiN, TiW. In some cases, the opaque layer 50 could be a dielectric material layers having an optical transparent and a light reflection property. The dielectric material layers having multiple layers to create a reflectivity on the bottom surface of the dielectric material layers. In some embodiments, multiple pair of high/low refractive index dielectric material layers could be utilized to be the opaque layer 50 to reflect the light. The dielectric material could be selected at least from one of $SiO_2$, $Si_3N_4$, $TiO_2$, $Al_2O_3$, $Ta_2O_5$, $HfO_2$, $LaTiO_2$, $Nb_2O_5$, $ZrO_2$, $MgF_2$, $LiF$.

Figure 17A:
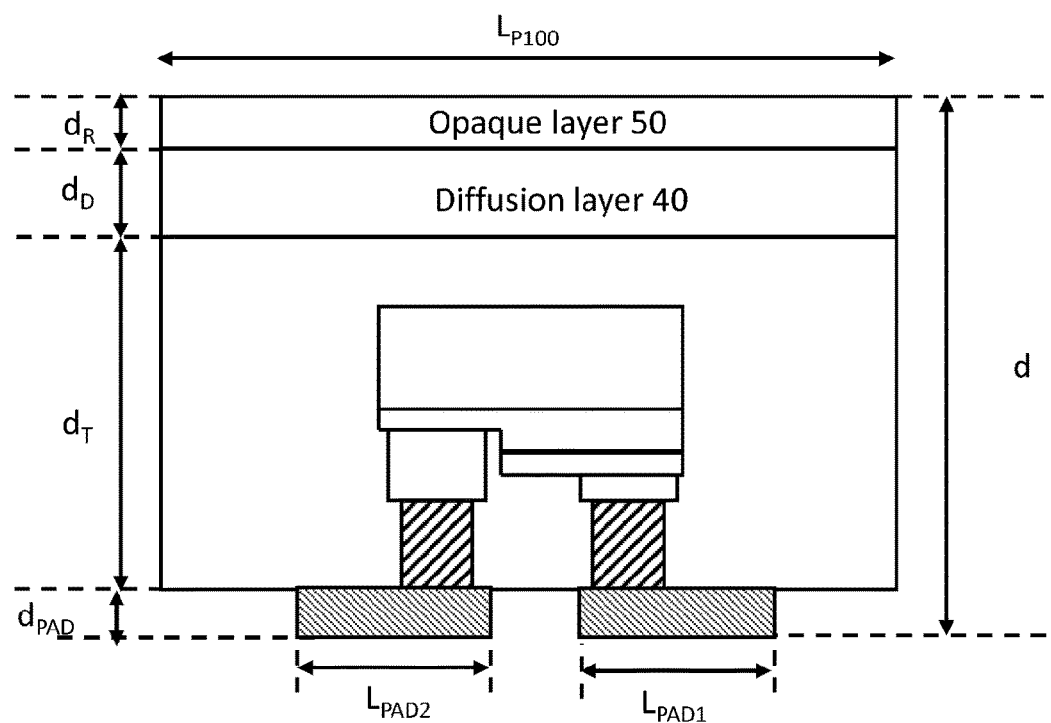
FIG. 17A shows a singulated packaged LED 100 after dicing.

Referring to FIG. 16. FIG. 17A shows a singulated packaged LED 100 after dicing. The length of the packaged LED 100 is $L_{P100}$ and The $L_{P100}$ is larger than that of the length of the LED ($L_{P100}$>$L_{LED}$). The thickness of these layers has the following relation:

$$d_T > d_D >> d_R$$

The thickness of $d_T$ has three times larger than that of the thickness of $d_D$. The thickness of the opaque layer $d_R$ is ranging from submicron meter to micron meters. The total thickness d ($d=d_R+d_D+d_T+d_{PAD}$) of the packaged LED 100 could be ranging from 100 um to 1000 um. Typically, the thickness of the packaged LED 100 could be made to be less than 250 um or even thinner. The thinner thickness of the packaged LED 100 is purposed to approach an achieve a thin uniform panel lighting.

Figure 17B:
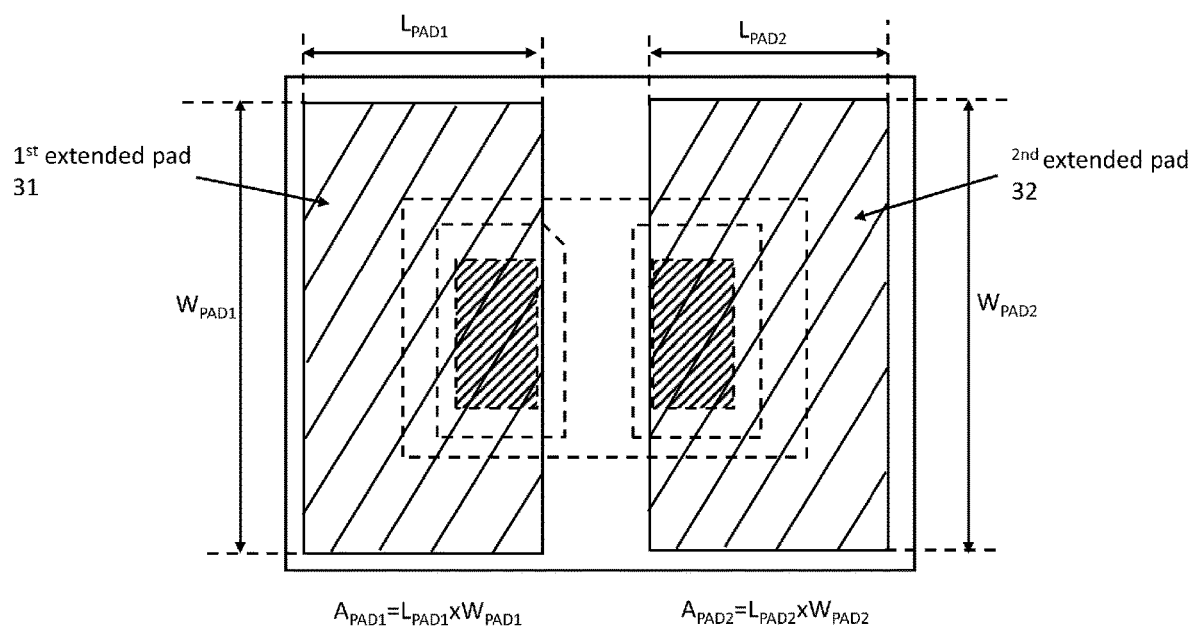
FIG. 17B is a first side view of the packaged LED 100.

FIG. 17B is a first side view of the packaged LED 100. The solid line is the scheme drawing of the view to show the extended pads, the dot line is the other related elements orientation and position underneath of the surface of the polymer layer 30 and the exposed extended metal layers. The length of the first extended pad $L_{PAD1}$ is larger than that of the length of the first extended metal layers L21 and the length of the first pad L11. The width of the first extended pad $W_{PAD1}$ is larger than that of the width of the first extended metal layers W21 and the length of the first pad W11. The area of the first extended pad $A_{PAD1}=L_{PAD1} \times W_{PAD1}$. Referring to FIG. 1A and FIG. 2A, the area $A_{PAD1}$ is larger than that of the area A21 and A11. The length of the second extended pad $L_{PAD2}$ is larger than that of the length of the second extended metal layers L22 and the length of the second pad L12. The width of the first extended pad $W_{PAD2}$ is larger than that of the width of the second extended metal layers W22 and the width of the second pad W12. The area of the second extended pad $A_{PAD2}=L_{PAD2} \times W_{PAD2}$. Referring to FIG. 1A and FIG. 2A, the area $A_{PAD2}$ is larger than that of the area A22 and A12. The larger size of the extended pad is purposed to fabricate a large area of the pads for a better shear force after utilizing a surface mounted technology (SMT). The size and area of the extended pad is enlarged to provide an enough contact area for soldering connection. The size and area of the extended pad is depended on the needed size of the packaged LED; thus, the size and area of the extended pad could be designed as large as possible depended on the needed package LED size. For an example, the pad size of the LED chip is about 100 um×200 um, the size of the extended pad could be enlarged to 250 um×550 um.

Figure 17C:
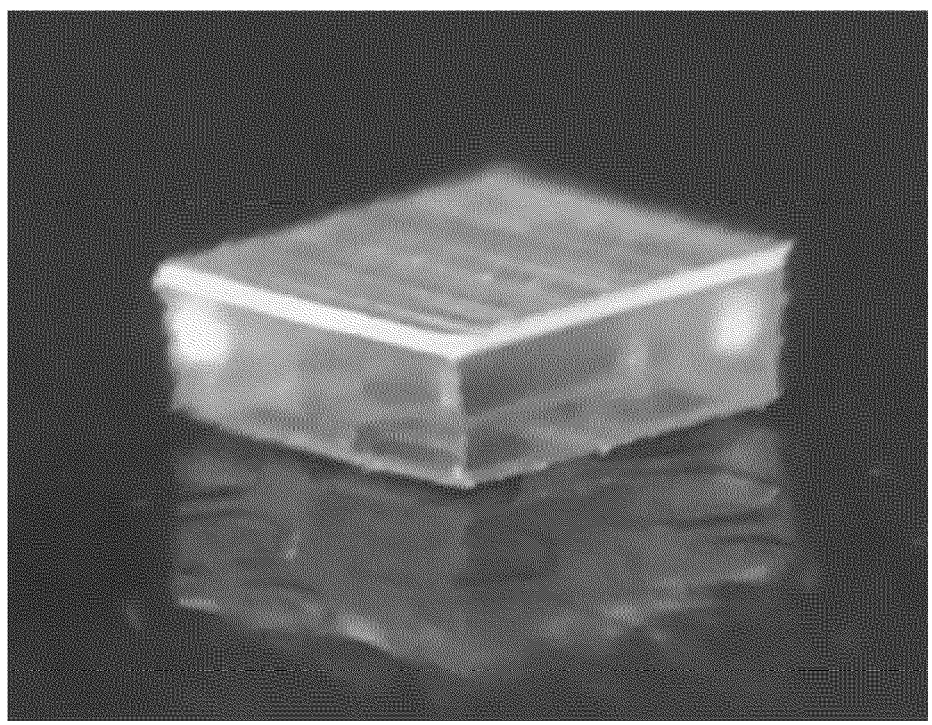
FIG. 17C is a picture of the packaged LED 100.
Figure 17D:
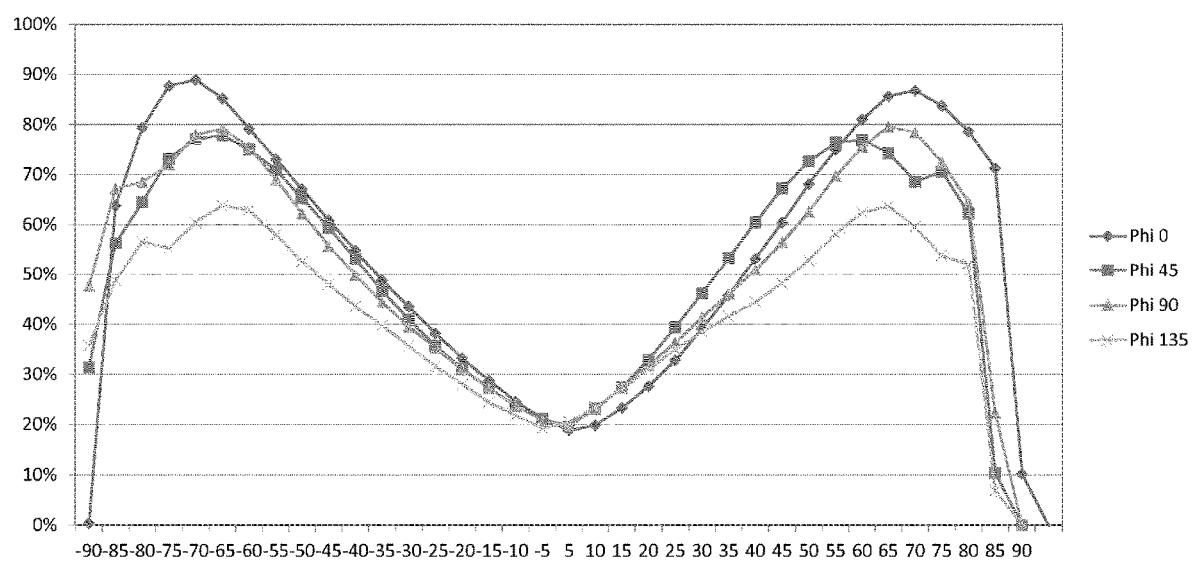
FIG. 17D shows the light pattern of the packaged LED 100.

FIG. 17C is a picture of the packaged LED 100. FIG. 17D shows the light pattern of the packaged LED 100. The far field light pattern has a batwing light pattern performance in different angles. The packaged LED 100 significantly reduced the light emission of the center vertical axis by 80% and maintained the peak angular emission at +/−65 degree (from the central vertical axis). The beam angle at 50% intensity is 165-170 degrees. The beam design is intended to reduce glare and improve area light uniformity in multi-LED applications. The reduction in thickness of the packaged LED 100 will allow system integration designers to create an ultra-thin uniform and dimming lighting requirement.

Figure 18:
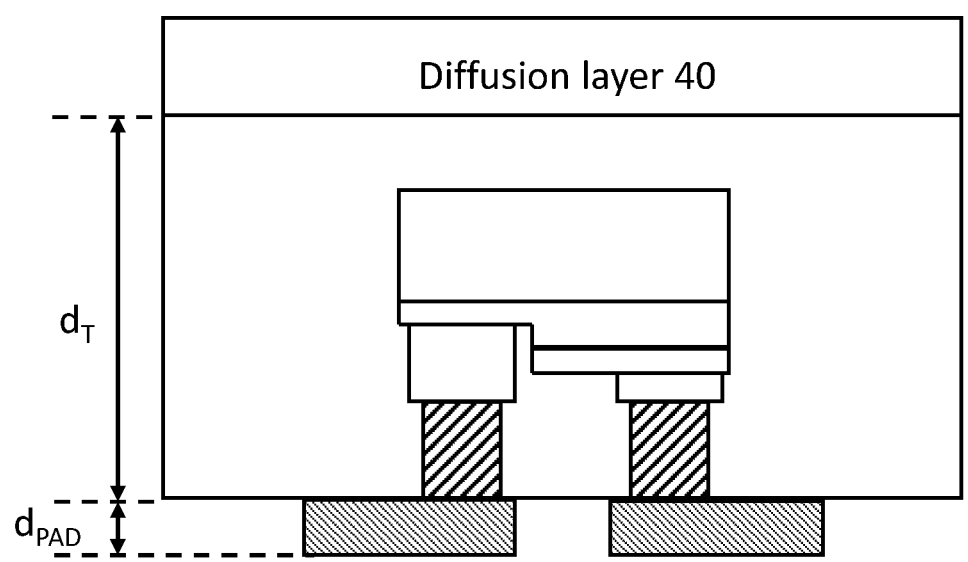
FIG. 18 shows a singulated packaged LED 101 after dicing.

Referring to FIG. 15, only the diffusion layer 40 disposed on top of the polymer layer 30. FIG. 18 shows a singulated packaged LED 101 after dicing.

Figure 19A:
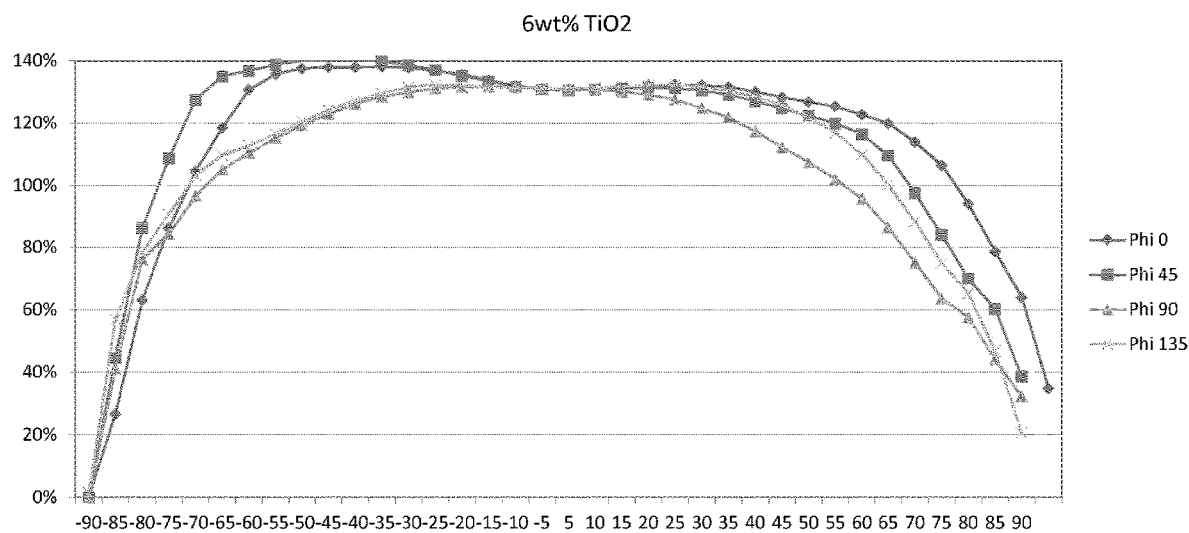
FIG. 19A shows a light pattern of the packaged LED 101 having a diffusion layer with 6 wt % $TiO_2$ mixing.
Figure 19B:
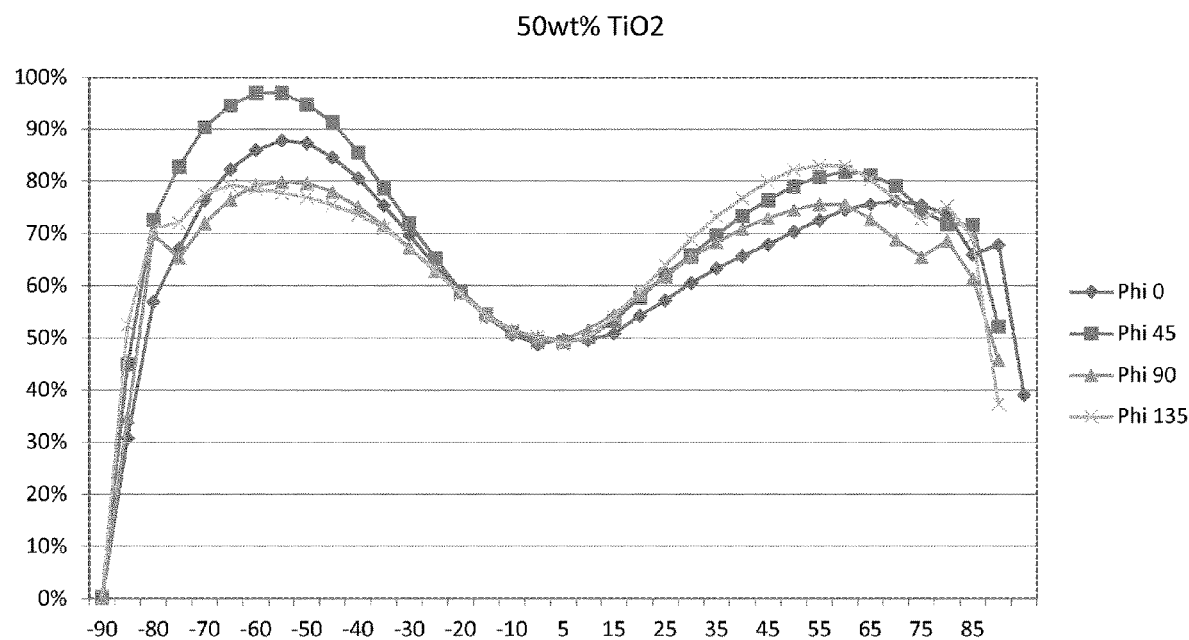
FIG. 19B shows a light pattern of the packaged LED 101 having a diffusion layer with 50 wt % $TiO_2$ mixing.

FIG. 19A shows a light pattern of the packaged LED 101 having a diffusion layer with 6 wt % $TiO_2$ mixing. The far field light pattern has a near Lambertian light pattern performance in different angles. FIG. 19B shows a light pattern of the packaged LED 101 having a diffusion layer with 50 wt % $TiO_2$ mixing. The far field light pattern has a near batwing light pattern performance in different angles. The packaged LED 101 reduced the light emission of the center vertical axis by 50% and maintained the peak angular emission at +/−60 degree (from the central vertical axis).

Referring to FIG. 5, FIG. 9 and FIG. 12, FIG. 20 shows an extended pads 55 disposed on the bottom surface (second surface) of the extended metal layers 25. The 1$^{st}$ extended pad 31 disposed on the second surface of the 1$^{st}$ extended metal layer 21 and electrically connected to the 1$^{st}$ type semiconductor layer. The 2$^{nd}$ extended pad 32 disposed on the second surface of the 2$^{nd}$ extended metal layer 22 and electrically connected to the 2$^{nd}$ type semiconductor layer. The thickness of the extended pads 55 is >1 um and typically is ranging from 5 um to 50 um.

Figure 20:
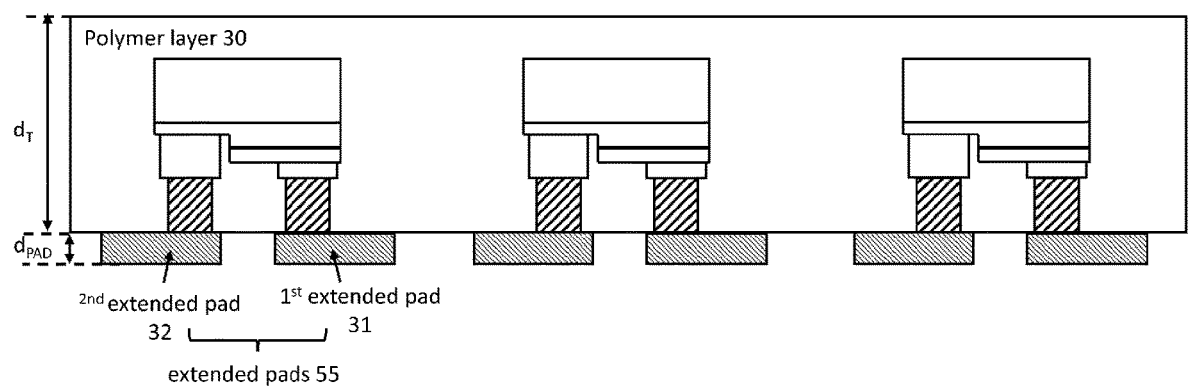
FIG. 20 shows an extended pads 55 disposed on the bottom surface (second surface) of the extended metal layers 25.
Figure 21:
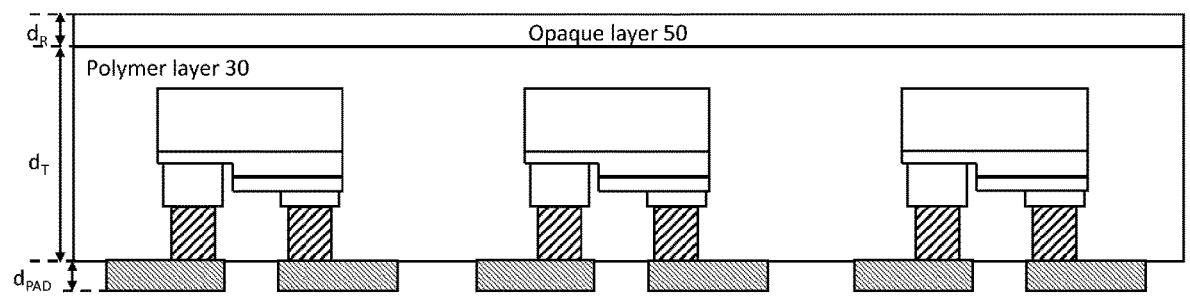
FIG. 21 shows an opaque layer 50 having a thickness $d_R$ directly disposed on the polymer 30.

Referring to FIG. 20, FIG. 21 shows an opaque layer 50 having a thickness $d_R$ is disposed on the polymer 30. The opaque layer 50 could have a light reflection property to reflect the light hitting the bottom surface of the opaque layer 50. The light from the LED chip could be reflected by the bottom surface of the opaque layer 50. The light from the LED chip may have multiple reflection and escape from the edge of the packaged LED. The top surface of the opaque layer could have the light reflection property to reflect the light from the space. The opaque layer 50 could be selected from metal layers and at least from one of Ti. Cr. Ni, Al, Ag, Au, W, TiN, TiW. In some cases, the opaque layer 50 could be a dielectric material layers having an optical transparent and a light reflection property. The dielectric material layers having multiple layers to create a reflectivity on the bottom surface of the dielectric material layers. In some embodiments, multiple pair of high/low refractive index dielectric material layers could be utilized to be the opaque layer 50 to reflect the light. The dielectric material could be selected at least from one of $SiO_2$, $Si_3N_4$, $TiO_2$, $Al_2O_3$, $Ta_2O_5$, $HfO_2$, $LaTiO_2$, $Nb_2O_5$, $ZrO_2$, $MgF_2$, LiF.

Figure 22A:
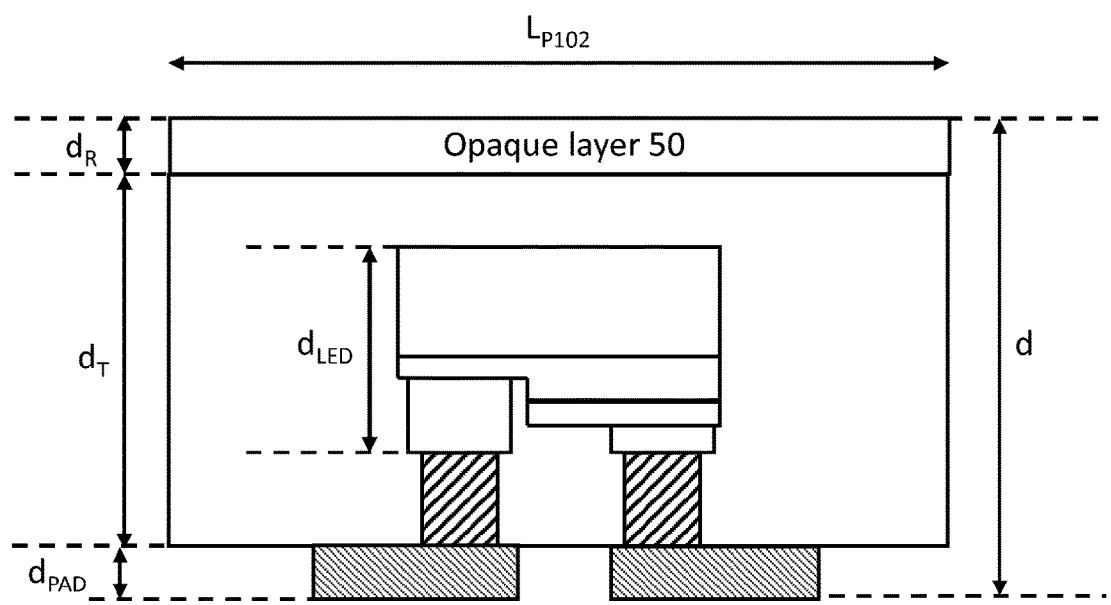
FIG. 22A shows a singulated packaged LED 102 after dicing.

Referring to FIG. 21. FIG. 22A shows a singulated packaged LED 102 after dicing. The length of the packaged LED 102 is $L_{P102}$ and The $L_{P102}$ is larger than that of the length of the LED ($L_{P102} > L_{LED}$). The thickness of these layers has the following relation:

$$d_T >> d_R$$

The thickness of $d_T$ is thicker than that of the LED chip thickness $d_{LED}$. The thickness of the opaque layer $d_R$ is ranging from submicron meter to micron meters. The total thickness d ($d = d_R + d_T + d_{PAD}$) of the packaged LED 100 could be ranging from 100 um to 1000 um. Compared to FIG. 17 structure, there has no diffusion layer; thus, the thickness of the packaged LED 100 could be made to be less than 200 um or even thinner. The thinner thickness of the packaged LED 100 is purposed to approach an achieve a thin uniform panel lighting.

Figure 22B:
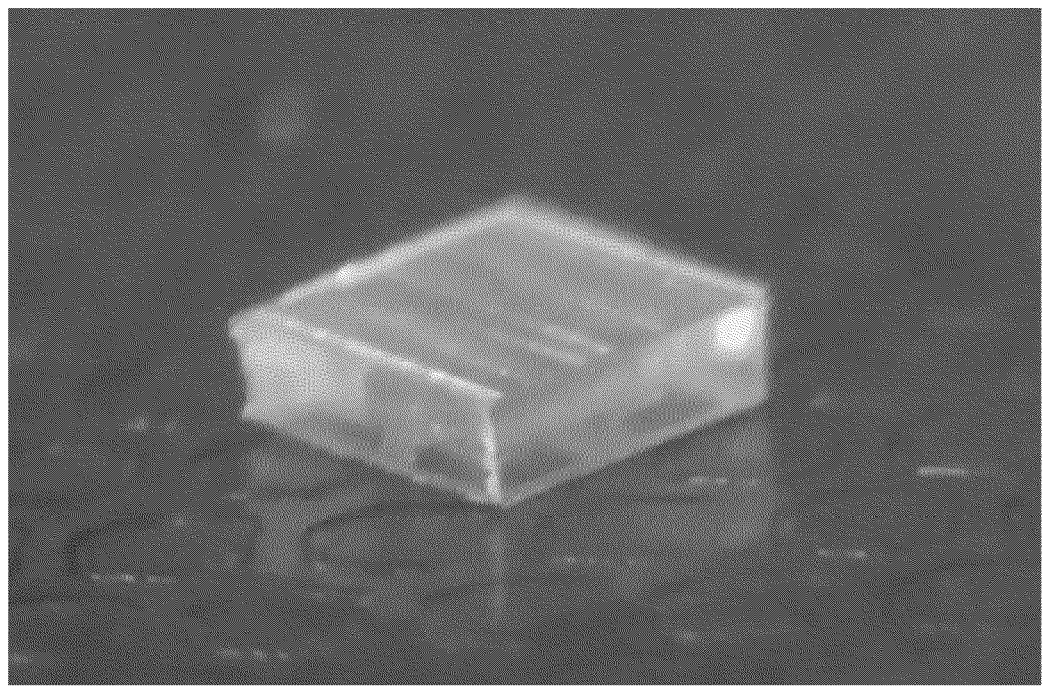
FIG. 22B is a picture of the packaged LED 102.
Figure 22C:
FIG. 22C shows the light pattern of the packaged LED 102.

FIG. 22B is a picture of the packaged LED 102. FIG. 22C shows the light pattern of the packaged LED 102. The far field light pattern has a batwing light pattern performance in different angles. The packaged LED 102 significantly reduced the light emission of the center vertical axis by 75-80% and maintained the peak angular emission at +/−65 degree (from the central vertical axis). The beam angle at 50% intensity is 165-170 degrees. The beam design is intended to reduce glare and improve area light uniformity in multi-LED applications. The reduction in thickness of the packaged LED 102 will allow system integration designers to enable an ultra-thin uniform and dimming lighting requirement.

Figure 23:
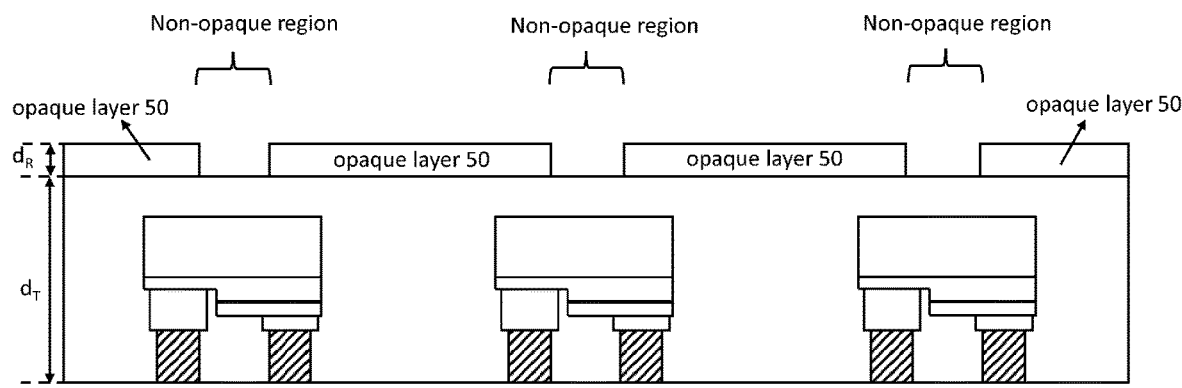
FIG. 23 shows another type to form the opaque layer 50 disposed on the top of the polymer layer.

Referring to FIG. 21, FIG. 23 shows another type to form the opaque layer 50 disposed on the top of the polymer layer. The opaque layer disposed on a portion of the top of the polymer layer to perform an opaque region and non-opaque region.

Figure 24:
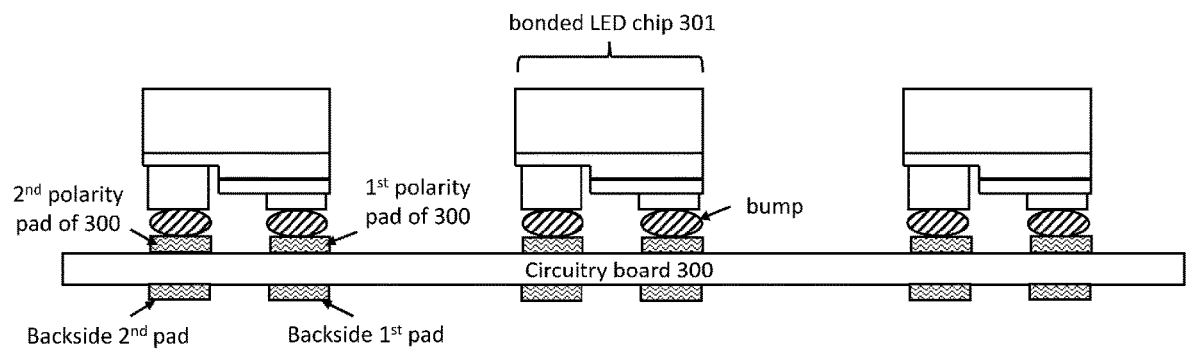
FIG. 24 shows the LED chip could be mounted to a circuitry board 300 to form a bonded LED chip 301.

In one embodiment, FIG. 24 shows the LED chip could be mounted to a circuitry board 300 to form a bonded LED chip 301. The bump is disposed on the pads of the LED chip and soldering to connect the pads to the pads of the circuitry board 300. The $1^{st}$ pad of the LED chip is electrically connected to the $1^{st}$ polarity pad of the circuitry board 300. The $1^{st}$ polarity pad of the circuitry board is through via to the backside $1^{st}$ pad. Similar, the $2^{nd}$ pad of the LED chip is electrically connected to the $2^{nd}$ polarity pad of the circuitry board 300. The $2^{nd}$ polarity pad of the circuitry board is through via to the backside $2^{nd}$ pad.

Figure 25:
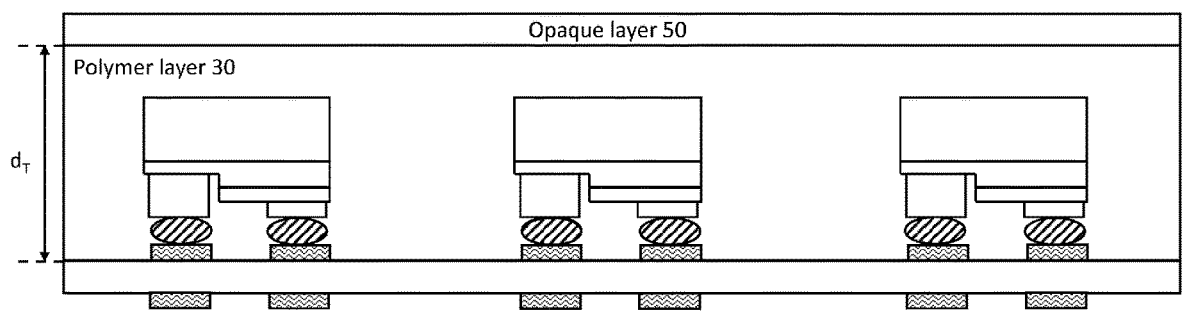
FIG. 25 shows the bonded LED chip 301 is covered by a polymer layer 30.

Referring to FIG. 24, FIG. 25 shows the bonded LED chip 301 is covered by a polymer layer 30. An opaque layer 50 could be disposed on top of the polymer layer 30.

Figure 26:
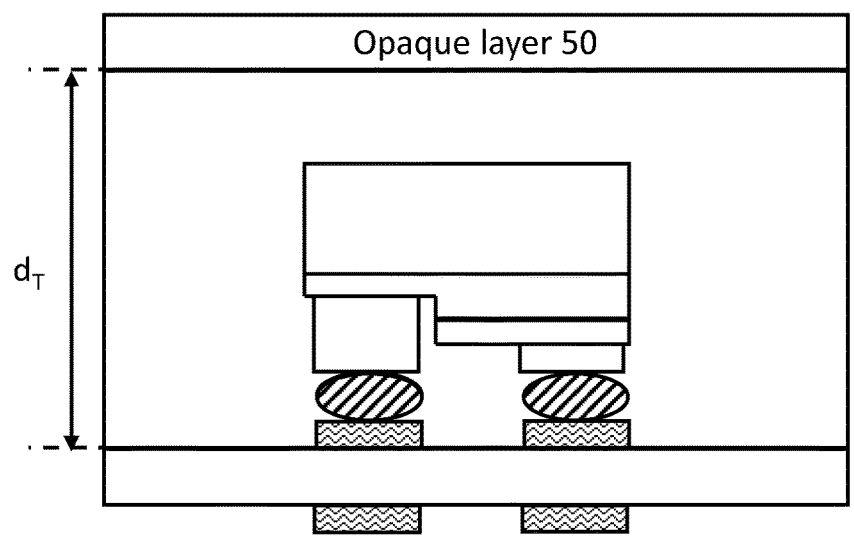
FIG. 26 shows a singulated packaged LED 103 after dicing.

Referring to FIG. 25. FIG. 26 shows a singulated packaged LED 103 after dicing.

Referring to FIG. 3, FIG. 4 and FIG. 21, FIG. 27 shows the original position of the polymer layer 30 is replaced by a color conversion layer 200. The color conversion layer 200 could be a transparent material mixing with a color converted material such as a phosphor material or a quantum dots (QDs) material. The mixing rate of the color converted material could be ranging from 0.0001 wt % to 90 wt %. The transparent material of the color conversion layer 200 could be selected from at least one of epoxy, silicone, hybrid silicone and epoxy, glue, acrylic, wax, Polyimide (PI), Polybenzoxazole (PBO), Benzocyclobutene (BCB). The phosphor material could be selected from oxy/nitride host materials, such as M-SiON (M=Ca, Sr, Ba), —SiAlON: are excellent phosphors for white LED using blue-emitting chip. The QDs material could be selected at least from CdSe/ZnS. The CdSe/ZnS/CdSZnS and CdSe/CdS/ZnS/CdSZnS for white color conversion.

Figure 27:
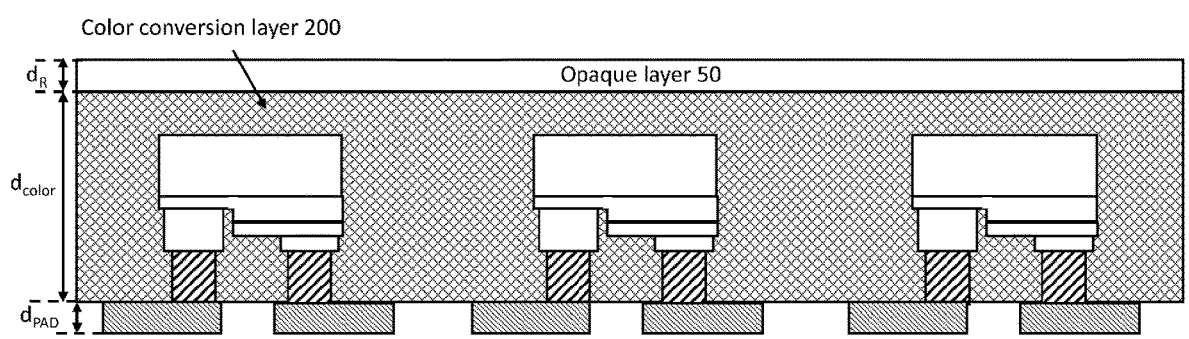
FIG. 27 shows the original position of the polymer layer 30 is replaced by a color conversion layer 200.
Figure 28:
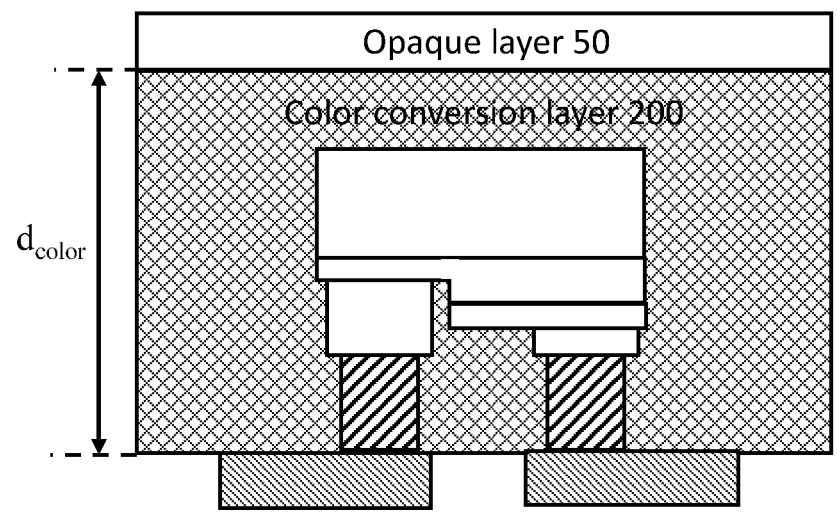
FIG. 28 shows a singulated packaged LED 104 after dicing.

Referring to FIG. 27. FIG. 28 shows a singulated packaged LED 104 after dicing. The packaged LED 104 could emit a color conversion light such as a white light.

Thus, the disclosure describes methods for fabricating a packaged LED. While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

While the present invention has been described by way of examples and in terms of preferred embodiments, it is to be understood that the present invention is not limited thereto. To the contrary, it is intended to cover various modifications. Therefore, the scope of the appended claims should be accorded the broadest interpretation so as to encompass all such modifications.

The invention claimed is:

1. A pad-extended LED chip comprising:
   a LED chip comprising a substrate, a first type semiconductor layer, an active layer and a second type semiconductor layer;
   a first pad electrically connected to the first type semiconductor layer and a second pad electrically connected to the second type semiconductor layer;
   a first pad extended metal layer making direct physical and electrical contact to the first pad and a second pad extended metal layer making direct physical and electrical contact to the second pad; and
   a first package extended pad electrically connected to the first pad extended metal layer and a second package extended pad electrically connected to the second pad extended metal layer.

2. The pad-extended LED chip of claim 1, wherein a sum of a first length of the first package extended pad, a second length of the second package extended pad and a spacing therebetween is larger than a third length of the LED chip.

3. The pad-extended LED chip of claim 1 wherein the first pad extended metal layer and the second pad extended metal layer have a same height level.

4. The pad-extended LED chip of claim 1 wherein a first thickness of the first pad extended metal layer and a second thickness of the second extended metal layer are respectively greater than 10 micrometers.

5. A packaged LED device comprising:
   a pad-extended LED chip comprising:
      an LED chip comprising a substrate, a first type semiconductor layer, an active layer and a second type semiconductor layer, and
      a first pad electrically connected to the first type semiconductor layer and a second pad electrically connected to the second type semiconductor layer; and
      a first pad extended metal layer making direct physical and electrical contact to the first pad and a second pad extended metal layer making direct physical and electrical contact to the second pad;
a polymer layer covering substantially all of the pad-extended LED chip except surfaces of the first extended metal layer and the second extended metal layer; and
a first package extended pad electrically connected to the first pad extended metal layer and a second package extended pad electrically connected to the second pad extended metal layer;
wherein a sum of a first length of the first package extended pad, a second length of the second package extended pad and a spacing therebetween is larger than a third length of the LED chip.

6. The packaged LED device of claim 5 further comprising an opaque layer on top of the polymer layer.

7. The packaged LED device of claim 6 wherein the opaque layer has a light reflection property.

8. The packaged LED device of claim 5 wherein the polymer layer comprises a color conversion layer.

9. The packaged LED device of claim 5 wherein a thickness of the polymer layer is greater than that of the LED chip.

10. A packaged LED device comprising:
a pad-extended LED chip comprising:
an LED chip comprising a substrate, a first type semiconductor layer, an active layer and a second type semiconductor layer; and
a first pad electrically connected to the first type semiconductor layer and a second pad electrically connected to the second type semiconductor layer;
a first pad extended metal layer making direct physical and electrical contact to the first pad and a second pad extended metal layer making direct physical and electrical contact to the second pad;
a polymer layer covering substantially all of the pad-extended LED chip except surfaces of the first pad extended metal layer and the second pad extended metal layer;
an opaque layer on the polymer layer; and
a first package extended pad electrically connected to the first pad extended metal layer and a second package extended pad electrically connected to the second pad extended metal layer.

11. The packaged LED device of claim 10 wherein a sum of a first length of the first package extended pad, a second length of the second package extended pad, and a spacing therebetween is larger than a third length of the LED chip.

12. The packaged LED device of claim 10 wherein the opaque layer has a light reflection property.

13. The packaged LED device of claim 10 wherein the polymer layer comprises a color conversion layer.

* * * * *